(12) United States Patent
Kent et al.

(10) Patent No.: US 12,745,562 B2
(45) Date of Patent: Sep. 22, 2026

(54) ENERGY STORAGE SYSTEMS AND METHODS

(71) Applicant: PXF Holding LLC, Findlay, OH (US)

(72) Inventors: Jereme Kent, Findlay, OH (US); Amir Sohrabi Mollayousef, Northfield, OH (US)

(73) Assignee: PXF Holding LLC, Findlay, OH (US)

( * ) Notice: Subject to any disclaimer, the term of this patent is extended or adjusted under 35 U.S.C. 154(b) by 0 days.

(21) Appl. No.: 18/989,797

(22) Filed: Dec. 20, 2024

(65) Prior Publication Data

US 2025/0127060 A1 Apr. 17, 2025

Related U.S. Application Data

(63) Continuation of application No. 17/201,679, filed on Mar. 15, 2021, now Pat. No. 12,193,330.

(51) Int. Cl.

| | |
|---|---|
| ***H10N 10/13*** | (2023.01) |
| ***H02N 11/00*** | (2006.01) |
| ***H10N 10/17*** | (2023.01) |

(52) U.S. Cl.

CPC .......... *H10N 10/13* (2023.02); *H02N 11/002* (2013.01); *H10N 10/17* (2023.02)

(58) Field of Classification Search

None

See application file for complete search history.

(56) References Cited

U.S. PATENT DOCUMENTS

| | | | |
|---|---|---|---|
| 3,729,042 | A | 4/1973 | Burnett |
| 4,099,381 | A | 7/1978 | Rappoport |
| 4,125,122 | A | 11/1978 | Stachurski |
| 4,609,036 | A | 9/1986 | Schrader |
| 5,722,249 | A | 3/1998 | Miller, Jr. |
| 5,929,372 | A | 7/1999 | Oudoire et al. |
| 7,621,129 | B2 | 11/2009 | DuBois |
| 8,658,881 | B2 | 2/2014 | Cheng et al. |
| 8,677,752 | B2 | 3/2014 | DuBois |
| 9,194,360 | B2 | 11/2015 | Payre et al. |
| 10,323,487 | B2 | 6/2019 | Frosell et al. |
| 2005/0139250 | A1 | 6/2005 | DeSteese et al. |

(Continued)

FOREIGN PATENT DOCUMENTS

| | | |
|---|---|---|
| CN | 202395699 | 8/2012 |
| CN | 110023582 | 7/2019 |

(Continued)

OTHER PUBLICATIONS

Australian Examination report No. 1, Application No. 2022237341, dated Oct. 31, 2025.

(Continued)

*Primary Examiner* — Tamir Ayad

(74) *Attorney, Agent, or Firm* — MacMillan, Sobanski & Todd, LLC

(57) ABSTRACT

The technical description relates to energy storage systems and methods. Specific examples described herein relate to methods of selectively discharging electrical energy from an energy storage system. An example method includes initializing an energy storage system, evaluating demand for electricity, evaluating tank temperatures, and updating the operational status of the energy storage system.

6 Claims, 8 Drawing Sheets

(56) References Cited

U.S. PATENT DOCUMENTS

| | | | |
|---|---|---|---|
| 2007/0119495 A1 | 5/2007 | Sumrall | |
| 2008/0128012 A1 | 6/2008 | Schick et al. | |
| 2009/0173336 A1 | 7/2009 | Leifer et al. | |
| 2009/0217664 A1 | 9/2009 | Rapp et al. | |
| 2009/0301687 A1 | 12/2009 | Watts | |
| 2010/0078054 A1 | 4/2010 | Chatterjee | |
| 2010/0101621 A1 | 4/2010 | Xu | |
| 2010/0243016 A1 | 9/2010 | Awashima et al. | |
| 2012/0303351 A1* | 11/2012 | Serrano Dorado | G05B 13/028 703/18 |
| 2013/0118543 A1 | 5/2013 | Kim et al. | |
| 2017/0005515 A1* | 1/2017 | Sanders | H02J 3/388 |
| 2018/0138383 A1 | 5/2018 | Lang | |

FOREIGN PATENT DOCUMENTS

| | | |
|---|---|---|
| DE | 102013218427 | 4/2015 |
| JP | 2005137138 | 5/2005 |
| JP | 20138780 | 1/2013 |
| KR | 101877006 | 7/2018 |
| WO | 2020209979 | 10/2020 |

OTHER PUBLICATIONS

PCT International Preliminary Report on Patentability, Application No. PCT/US2022/019504, mailed Sep. 28, 2023.

PCT International Search Report and Written Opinion, Application No. PCT/US2022/019504, dated Jun. 17, 2022.

Liu et al., “A1 KW Thermoelectric Generator for Low-temperature Geothermal Resources”, Proceedings, Thirty-Ninth Workshop on Geothermal Reservoir Engineering Stanford University, 2014, pp. 1-12.

Mexican substantive examination report, Application No. MX/a/2023/010907, dated Jan. 28, 2026.

* cited by examiner 190
206
200
195
196
208
204
194
197
199
198
202
192

ENERGY STORAGE SYSTEMS AND METHODS

FIELD

The disclosure relates to the field of energy storage. More particularly, the disclosure relates to energy storage systems and methods. Specific examples described herein relate to in-ground energy storage systems and methods of selectively discharging electrical energy from an energy storage system.

BACKGROUND

While several energy storage systems and methods for selectively discharging electrical energy from storage systems are known, existing systems and methods have several disadvantages, particularly when considered for utility scale applications. For example, pumped hydroelectric storage is dependent on particular topography, which significantly limits the locations at which these systems and methods can be installed and deployed. Similarly, compressed air energy storage depends on particular subsurface geology, which significantly limits the locations at which it can be installed and deployed. Battery energy storage has received considerable development attention in recent years. Despite these efforts, the technology remains relatively expensive when considered for utility scale applications. Furthermore, battery systems are dependent on the use of toxic materials and carry significant risk of fire and explosion. Flywheel energy storage remains attractive for its simplicity, but involves kinetic energy risk and, to date, has not proved scalable to utility level applications.

A need exists, therefore, for improved energy storage systems and methods.

BRIEF SUMMARY OF SELECTED EXAMPLES

Various energy storage systems are described herein.

An example energy storage system comprises a first fluid storage tank, a second fluid storage tank, a first fluid disposed in the first fluid storage tank, a second fluid disposed in the second fluid storage tank, a heating unit operably connected to the first fluid storage tank and adapted to heat the first fluid, a cooling unit operably connected to the second fluid storage tank and adapted to cool the second fluid, and an energy conversion unit exposed to the first fluid and the second fluid. The energy conversion unit is adapted to convert a temperature difference between the first fluid and the second fluid directly to electrical energy or indirectly to electrical energy through intermediate mechanical work, such as rotational motion.

Another example energy storage system comprises a first in-ground fluid storage tank, a second in-ground fluid storage tank, a first fluid disposed in the first fluid storage tank, a second fluid disposed in the second fluid storage tank, a heating unit operably connected to the first fluid storage tank and adapted to heat the first fluid, a cooling unit operably connected to the second fluid storage tank and adapted to cool the second fluid, and an energy conversion unit exposed to the first fluid and the second fluid. The energy conversion unit is adapted to convert a temperature difference between the first fluid and the second fluid directly to electrical energy or indirectly to electrical energy through intermediate mechanical work, such as rotational motion in-ground, insulated fluid storage tank.

Another example energy storage system comprises a first in-ground fluid storage tank, a second in-ground fluid storage tank, a first fluid disposed in the first fluid storage tank, a second fluid disposed in the second fluid storage tank, a heating unit operably connected to the first fluid storage tank and adapted to heat the first fluid, a cooling unit operably connected to the second fluid storage tank and adapted to cool the second fluid, and a thermoelectric generator exposed to the first fluid and the second fluid. The thermoelectric generator is adapted to convert a temperature difference between the first fluid and the second fluid directly to electrical energy.

Another example energy storage system comprises a first in-ground fluid storage tank, a second in-ground fluid storage tank, a first fluid disposed in the first fluid storage tank, a second fluid disposed in the second fluid storage tank, a heating unit operably connected to the first fluid storage tank and adapted to heat the first fluid, a cooling unit operably connected to the second fluid storage tank and adapted to cool the second fluid, and a heat engine exposed to the first fluid and the second fluid. The heat engine is adapted to convert a temperature difference between the first fluid and the second fluid to rotational motion. In an example, the heat engine is a Stirling engine that is connected to an electric motor for generating electricity.

Various methods of selectively discharging electrical energy from an energy storage system are described herein.

An example method of selectively discharging electrical energy from an energy storage system comprises initializing an energy storage system; evaluating demand for energy and price of energy parameters to identify a desirable operational phase of the energy storage system; evaluating the tank temperatures in the fluid storage system; and updating the operational status of the energy storage system. In some example methods, the steps of evaluating demand for energy and price of energy parameters and evaluating the tank temperatures are repeated at a desired frequency, such as at least once each hour, at least once each minute, or at least once each second.

Additional understanding of the inventive systems and methods can be obtained by reviewing the detailed description of selected examples, below, with reference to the appended drawings.

DESCRIPTION OF SELECTED EXAMPLES

The following detailed description and the appended drawings describe and illustrate various example systems and methods. The description and illustration of these examples enable one skilled in the art to make and use examples of the inventive systems and to perform the inventive methods. They do not limit the scope of the claims in any manner.

As used herein, the term "in-ground," and related grammatical terms, refers to the status of a structural member, such as a fluid storage tank, being positioned at least partially in the earth such that at least a lower portion of the structural member is positioned entirely below ground level. The entire structural item need not be entirely disposed below ground level to be considered "in-ground."

As used herein, the term "utility scale," and related grammatical terms, refers to a capacity property of an energy storage system. Specifically, the term refers to the ability of an energy storage system to store at least one billion watt hours, which is equivalent to one million kilowatt hours. While used to describe specific examples, it is noted that the inventive systems and methods are not limited to any particular capacity and, indeed, can be scaled from capacity suitable for relatively small levels of consumption (single family and multiple family residential applications, for example), to capacity suitable for relatively large levels of consumption (commercial and other applications, for example), to capacity suitable for utility scale, and even beyond. Capacity of the inventive systems is a function of overall size of the installation and volume of the tanks, and can be scaled up until limitations created by these parameters are met.

Inventive energy storage systems include first and second fluid storage tanks, a first fluid disposed in the first fluid storage tank, a second fluid disposed in the second fluid storage tank, a heating unit operably connected to the first fluid storage tank and adapted to heat the first fluid, a cooling unit operably connected to the second fluid storage tank and adapted to cool the second fluid, and an energy conversion unit exposed to the first fluid and the second fluid and adapted to convert a temperature difference between the first and second fluids directly to electrical energy or indirectly to electrical energy through intermediate mechanical work, such as rotational motion.

Figure 1:
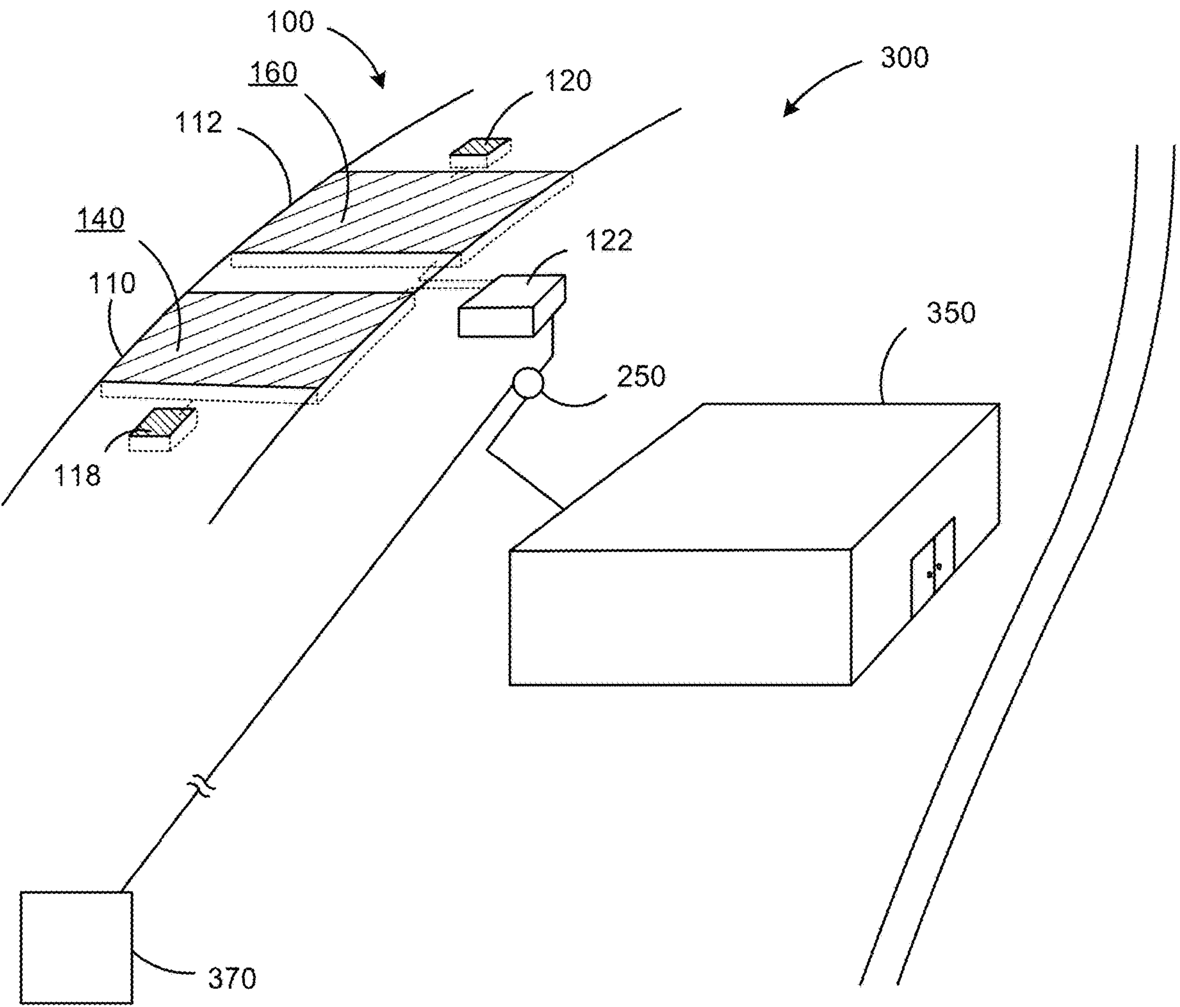
FIG. 1 is a site view of a plant including an example energy storage system.
Figure 2:
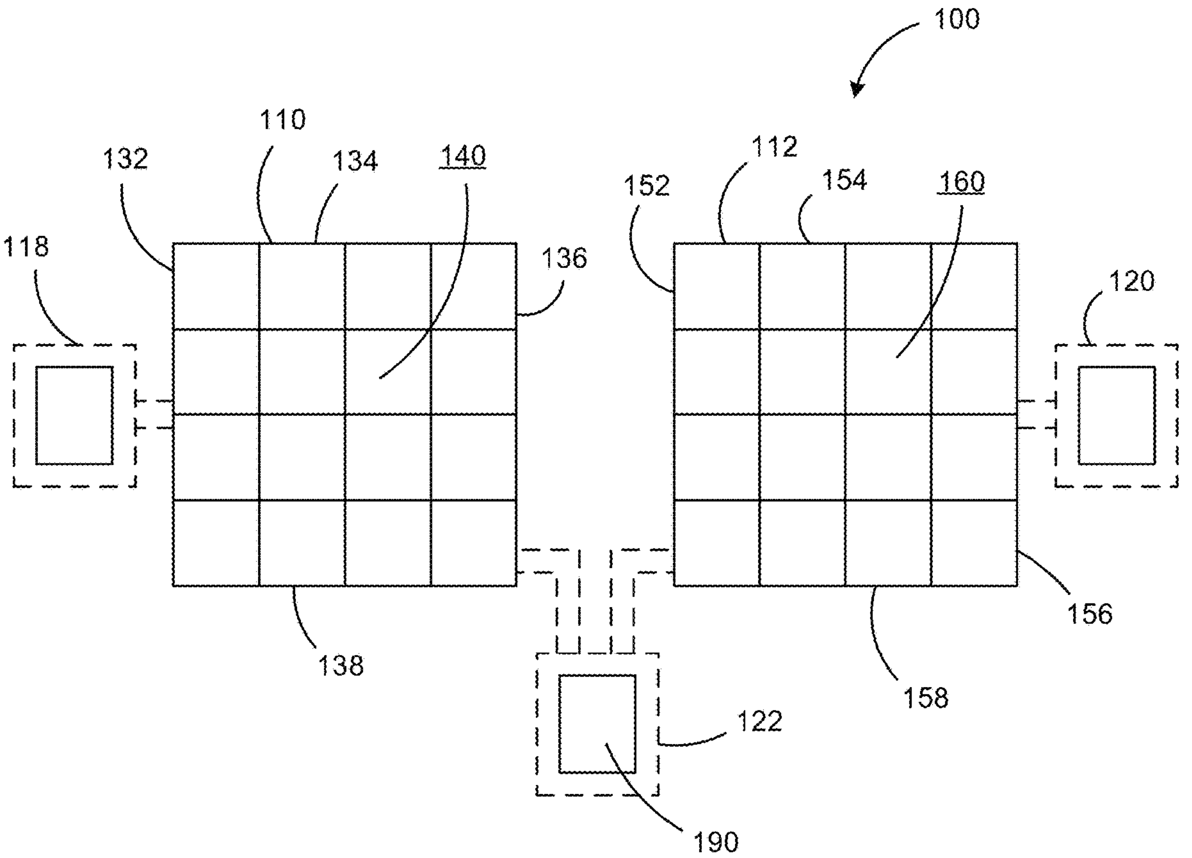
FIG. 2 is a top view of an example energy storage system.
Figures 3, 3A:
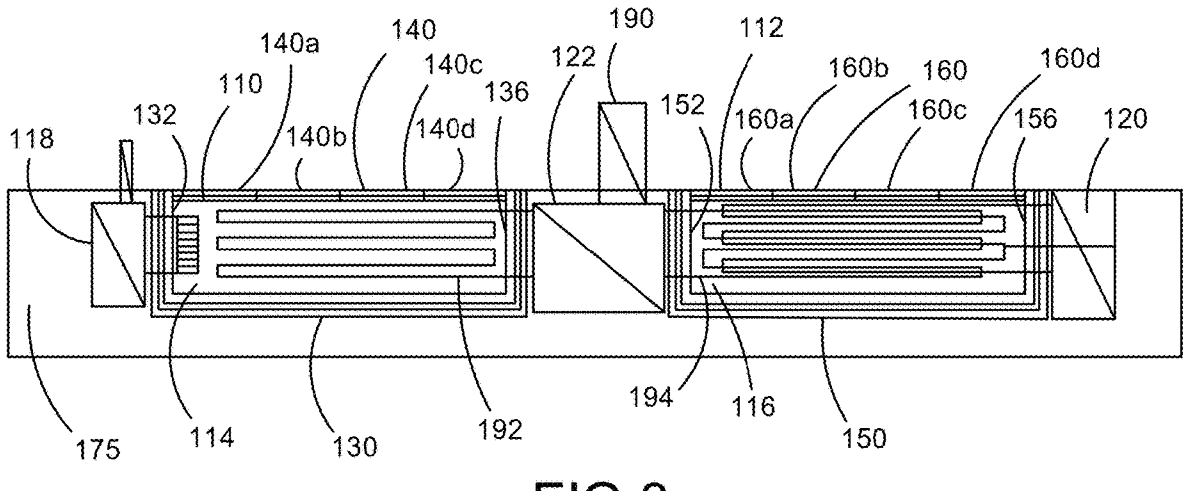
FIG. 3 is a sectional view of the energy storage system illustrated in FIG. 1.
FIG. 3A is an isolated perspective view of the energy conversion unit of the energy storage system illustrated in FIG. 1.
Figure 4:
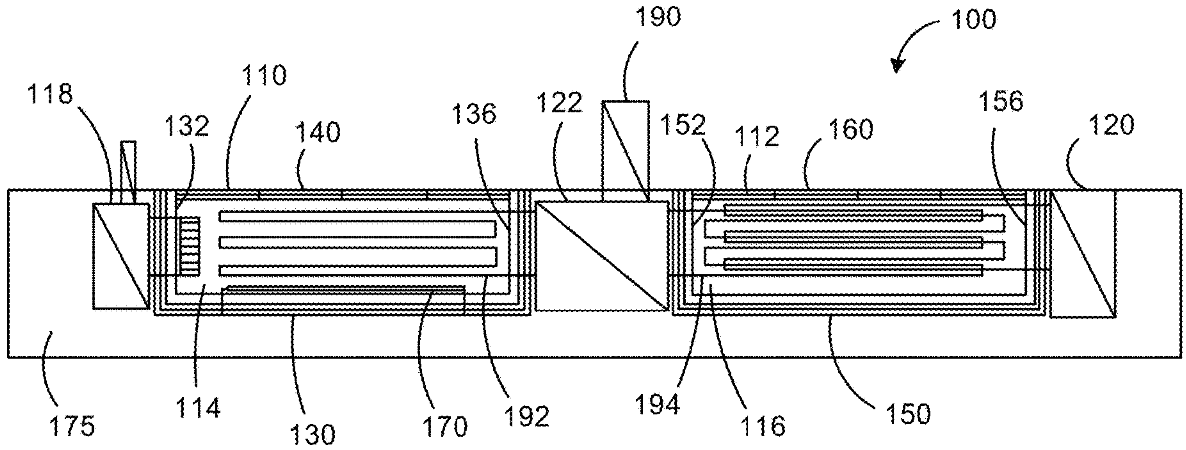
FIG. 4 is a sectional view of the energy storage system illustrated in FIG. 1 during a loading phase of operation.
Figure 5:
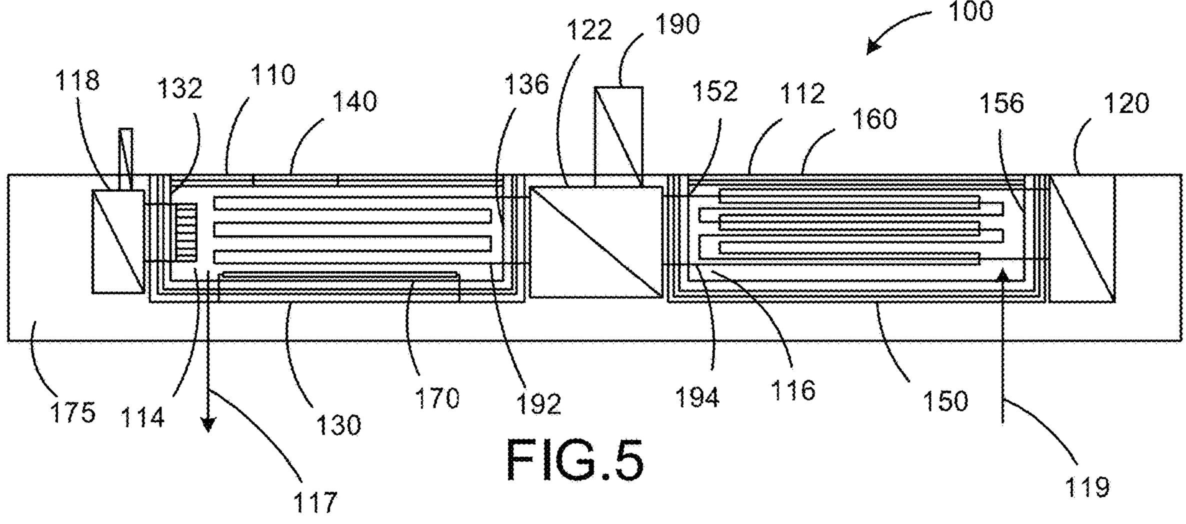
FIG. 5 is a sectional view of the energy storage system illustrated in FIG. 1 during a storage phase of operation.
Figure 6:
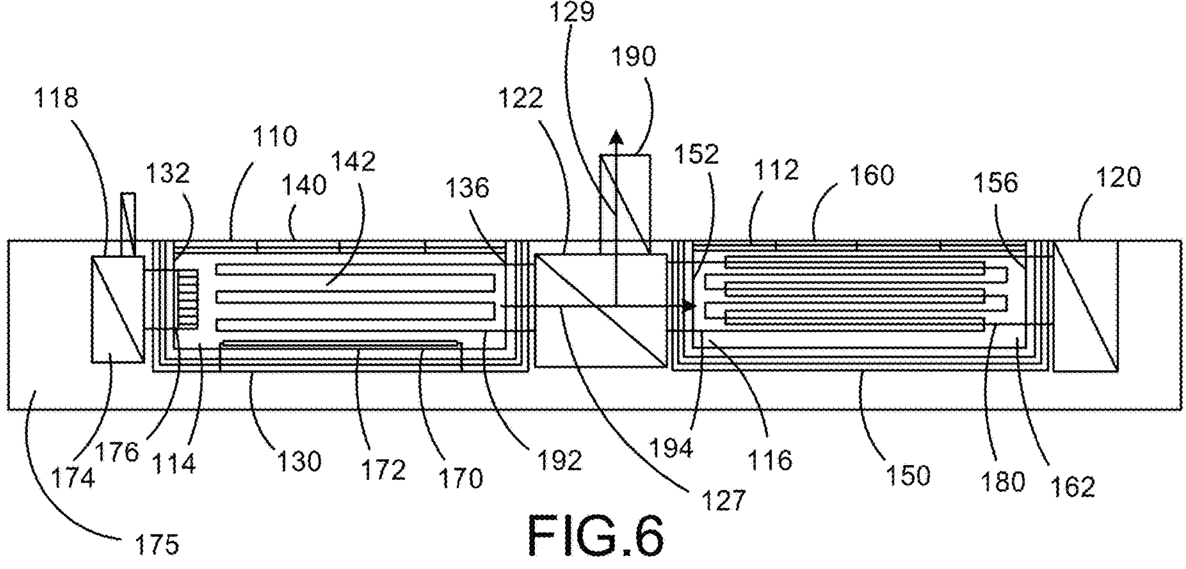
FIG. 6 is a sectional view of the energy storage system illustrated in FIG. 1 during a discharge phase of operation.

FIGS. 1, 2, 3, 4, 5, and 6 illustrate an example energy storage system 100. FIG. 1 illustrates a site 300 at which the energy storage system has been installed, including an energy-consuming facility 350 and a utility grid 370 in selective electrical communication with the energy storage system 100. FIGS. 2 and 3 illustrate the general structural components of the system 100, including optional components. Each of FIGS. 4, 5, and 6 illustrates the system 100 in a specific phases of operation.

The energy storage system 100 includes a first fluid storage tank 110 and a second fluid storage tank 112. A first fluid 114 is disposed in the first fluid storage tank 110 and a second fluid 116 is disposed in the second fluid storage tank 112. A heating unit 118 is operably connected to the first fluid storage tank 110 and adapted to heat the first fluid 114. A cooling unit 120 is operably connected to the second fluid storage tank 112 and adapted to cool the second fluid 116. An energy conversion unit 122 is exposed to the first fluid 114 and the second fluid 116 and adapted to convert a temperature difference between the first 114 and second fluids 116 directly to electrical energy or indirectly to electrical energy through intermediate mechanical work, such as rotational motion.

In this example, each of the fluid storage tanks 110, 112 comprises an in-ground, insulated fluid storage tank. As best illustrated in FIG. 2, the fluid storage tanks 110, 112 are disposed adjacent each other with the energy conversion unit 122 disposed between the tanks 110, 112. Furthermore, also as best illustrated in FIG. 2, the tanks 110, 112 are situated such that the fluids 114, 116 are level with each other when each of the tanks 110, 112 is filled to capacity with its respective fluid 114, 116. While fluid storage tanks in other example embodiments can be positioned entirely in-ground, such that the entirety of each tank is positioned below ground level, the positioning of the fluid storage tanks 110, 112 in this example is considered advantageous at least because it represents a balance between the insulative properties provided by exposure of bottom 130, 150 and sidewalls 132, 134, 136, 138, 152, 154, 156, 158 to the earth 175 and the ease of access to the chambers of the fluid storage tanks provided by the absence of earth disposed over the covers 140, 160 of the fluid storage tanks.

The first fluid storage tank 110 has a bottom wall 130, first 132, second 134, third 136, and fourth 138 side walls, and a cover 140 that cooperatively define a chamber 142. The first fluid 114 is disposed in the chamber 142 and contacts at least the bottom wall 130, first 132, second 134, third 136, and fourth 138 side walls, and optionally the cover 140. Similarly, the second fluid storage tank 112 has a bottom wall 150, first 152, second 154, third 156, and fourth 158 side walls, and a cover 160 that cooperatively define a chamber 162. The second fluid 116 is disposed in the chamber 162 and contacts at least the bottom wall 150, first 152, second 154, third 156, and fourth 158 side walls, and optionally the cover 160.

For each of the tanks 110, 112, the walls and cover can be formed of any suitable material and have any suitable construction. A skilled artisan will be able to select appropriate material and construction for all walls and the cover for a tank in an energy storage system according to a particular embodiment based on various considerations, including the fluid intended to be stored within the tank and the composition of the ground surrounding the tank. The material chosen should provide structural integrity to the tank in ground, and should also provide and insulative effect to fluid stored within the tank (e.g., resist energy dissipation from or to fluid stored within the tank). The inventor has determined that concrete is particularly advantageous for each of the walls and cover at least because of its structural integrity, insulative properties, and ready availability. Composition of the walls and cover in a system according to a particular embodiment can vary, though, and can be selected based on the climate in the locality of the system. Concrete provides an insulative material that is suitable in a wide variety of climates, but other materials can be used in other climates. For example, relatively stronger materials that require less maintenance over time, such as steel, can be used, particularly in combination with additional insulative materials for the walls (foam, for example).

For each of the tanks 110, 112, the cover 140, 160 advantageously comprises multiple cover modules **140*a*, 140*b*, 140*c*, 140*d*, and 160*a*, 160*b*, 160*c*, 160*d* that can be positioned adjacent each other to form the respective cover 140, 160. This modular construction is considered advantageous at least because it provides access to fluid 114, 116 stored in the respective tank 110, 112 without necessitating removal of the entire cover 140, 160, which minimizes dissipation of energy from or to the fluid 114, 116 stored within the respective tank 110, 112 during any necessary or desirable access to the chamber 142, 162 and/or fluid 114, 116**.

Each of the tanks 110, 112 is advantageously constructed such that each of its sidewalls 132, 134, 136, 138, 152, 154, 156, 158 has a length that is greater than its height. As a result, each chamber 142, 162 has a height 145, 165 that is less than its width as measured along any of its sidewalls 132, 134, 136, 138, 152, 154, 156, 158. This structural configuration is considered particularly advantageous at least because it facilitates installation and operation of tanks for relatively large scale operations, such as utility scale energy storage systems.

Dimensions of the fluid storage tanks are critical to the capacity of energy storage systems according to the invention. In general, volume of the chambers of the tanks is directly related to the capacity of the energy storage system. The inventor has determined that inclusion of first and second fluid storage tanks having the same length, width, and depth is advantageous at least because this structural arrangement facilitates installation and operation of an energy storage system according to an embodiment. It is noted, though, that first and second fluid storage tanks that differ from each other in at least one dimension can be used, and may be necessary or desired for systems according to particular embodiments, based on site size, landscape, and geology, for example. The inventor has also determined that inclusion of one or both fluid storage tanks having at least one of a length and width that is at least 5 times the depth of the fluid storage tanks provides desirable capacity, ease of installation, and operational efficiency for an energy storage system according to an embodiment. The inventor has also determined that inclusion of one or both fluid storage tanks having at least one of a length and width that is at least 10 times the depth of the tanks provides advantageous capacity, ease of installation, and operational efficiency for an energy storage system according to an embodiment. The inventor has also determined that inclusion of one or both fluid storage tanks having at least one of a length and width that is at least 20 times the depth of the tanks provides particularly advantageous capacity, ease of installation, and operational efficiency for an energy storage system according to an embodiment. These structural configurations also suitable for a wide variety of installation sites as they limit the depth required for system installation.

A skilled artisan will be able to select suitable dimensions for each of the fluid storage tanks in an energy storage system according to a particular embodiment based on various considerations, including any desired capacity of the energy storage system, the available land at the installation site for the energy storage system, and the topography of the ground at the installation site for the energy storage system. It is considered particularly advantageous to minimize the depth dimension of the fluid storage tanks in the system while maximizing the length and width dimensions of the fluid storage tanks when determining overall dimensions for the fluid storage tanks, for reasons described above. Also, while cuboid fluid storage tanks, i.e., tanks in which each wall is a rectangle, are described herein, it is noted that fluid storage tanks having any suitable structural configuration can be used, including cylindrical fluid storage tanks. In a specific example contemplated by the inventor, an energy storage system according to an embodiment of the invention includes a first fluid storage tank that is 22' long, 22' wide, and 10' deep. In this specific example, the second fluid storage tank has the same dimensions. The energy storage system according to this specific example is considered particularly advantageous at least because, when used with water as the first and second fluids, the energy storage system has a calculated capacity of 10 MWh and an estimated discharge time of 1 hour, properties considered advantageous for relatively small scale applications, such as residential applications. In another specific example contemplated by the inventor, an energy storage system according to an embodiment of the invention includes a first fluid storage tank that is 71' long, 71' wide, and 10' deep. In this specific example, the second fluid storage tank has the same dimensions. Each of the fluid storage tanks can hold about 327,000 gallons of fluid. The energy storage system according to this specific example is considered particularly advantageous at least because, when used with water as the first and second fluids, the energy storage system has a calculated capacity of 100 MWh and an estimated discharge time of 10 hours, properties considered advantageous for intermediate scale applications, such as dedicated commercial applications. In a specific example contemplated by the inventor, an energy storage system according to an embodiment of the invention includes a first fluid storage tank that is 223' long, 223' wide, and 10' deep. In this specific example, the second fluid storage tank has the same dimensions. Each of the fluid storage tanks can hold about 3.7 million gallons of fluid. The energy storage system according to this specific example is considered particularly advantageous at least because, when used with water as the first and second fluids, the energy storage system has a calculated capacity of 1000 MWh (1 GWh) and an estimated discharge time of 100 hours, properties considered advantageous for large scale applications, such as utility scale deployments. Also, the fluid storage tanks in an energy storage system according to a particular embodiment can have any suitable geometric configuration. The examples described above, in which each fluid storage tank has the same length and width, are merely examples and this geometric configuration is not required. Indeed, a skilled artisan will be able to select a suitable geometric configuration for the fluid storage tanks in an energy storage system according to a particular embodiment based on various considerations, including boundaries, other structures (buildings, for example), and geology associated with the site on which the system is being installed. For example, an L-shaped fluid storage tank, or fluid storage tanks, may be desirable or necessary on some sites to accommodate an existing building or other structure.

The first 114 and second 116 fluids can comprise any suitable fluid capable of being heated and/or cooled. The fluids 114, 116 can comprise the same or different fluids. Water is considered particularly advantageous for use as both the first 114 and second 116 fluids at least because of its ease of handling, relative abundancy, low cost, available heating and cooling technologies, and its well-characterized thermal properties, including its relatively high specific heat (ability to store energy through heating and cooling). While the theoretical efficiency of energy storage systems according to embodiments in which the first and second fluids comprise water is relatively low (~10-15%), the advantages provided by using water as the first and second fluids, as described above, far outweigh any efficiency concerns. This is particularly true when the ability to scale capacity of the energy storage systems is considered, which is limited only by available ground space for installing the fluid storage tanks. Examples of other suitable, but less desirable, fluids for use in energy storage systems according to embodiments include oil, ethylene glycol, glycerin, and refrigerant fluids.

The heating unit 118 is operably connected to the first fluid storage tank 110 and adapted to heat the first fluid 114. The heating unit 118 can comprise any suitable heating unit that can be adapted to heat the first fluid 114 stored in the first fluid storage tank 110 and a skilled artisan will be able to select a suitable heating unit based on various considerations, such as the fluid intended to be used as the first fluid 114 and types and costs of energy available at the location of installation of the energy storage system. Examples of suitable heating units include electrical heaters, natural gas heaters, induction heaters, geothermal heaters, and other types of heaters. Furthermore, as best illustrated in FIGS. 3, 4, and 5, multiple heating units can be used. In this example, the heating unit 118 comprises an electrical induction heater 170 partially disposed in the ground adjacent the first tank 110 and having a heating coil 172 partially disposed within the chamber 142 and in contact with the first fluid 114. An optional auxiliary natural gas-powered heater 174 is partially disposed in the ground adjacent the first tank 110 and has a heating coil 176 disposed in the chamber 142 and in contact with the first fluid 114. Inclusion of a multiple heating units is considered advantageous at least because it provides redundant heating capability and a desirable level of control over the energy consumption by the energy storage system. Indeed, inclusion of two heating units, each of which operates on a different energy source (electric and natural gas, for example), is considered particularly advantageous at least because it provides an ability to utilize both heating units at the same time, when desired or necessary, while also providing a redundant heating unit that can be engaged when a primary heating unit is not functioning or functioning at a reduced level for some reason.

The cooling unit 120 is operably connected to the second fluid storage tank 112 and adapted to cool the second fluid 116. The cooling unit 120 can comprise any suitable cooling unit that can be adapted to cool the second fluid 116 stored in the second fluid storage tank 112 and a skilled artisan will be able to select a suitable cooling unit based on various considerations, such as the fluid intended to be used as the second fluid 116 and types and costs of energy available at the location of installation of the energy storage system. Examples of suitable cooling units include electrical refrigeration units, liquid nitrogen cooling systems, absorption refrigeration units, and heat pumps. Furthermore, multiple cooling units can be used. In this example, the cooling unit 120 comprises an electric refrigeration unit disposed in the ground adjacent the second tank 112 and having a cooling coil 180 disposed in the chamber 162 and in contact with the second fluid 116.

The energy conversion unit 122 is exposed to both the first fluid 114 and the second fluid 116 and adapted to convert a temperature difference between the first 114 and second fluids 116, which is created and/or maintained by operation of the heating 118 and cooling 120 units, directly to electrical energy or indirectly to electrical energy through intermediate mechanical work, such as rotational motion. Examples of suitable energy conversion units include thermoelectric generators and Stirling engines. Thermoelectric generators are considered particularly advantageous for use as the energy conversion unit at least because of their solid state construction and lack of moving parts, which decreases maintenance time and expense and increases the operational lifetime of the energy conversion unit. While thermoelectric generators operate at relatively low efficiency (currently, the highest possible efficiency is expected to be about 15%), the advantageous provided by their solid state construction provides sufficient advantage in the inventive systems and, indeed, contributes to the advantageous operational costs of the systems described herein.

As best illustrated in FIGS. 3 and 3A, the example energy storage system 100 includes a thermoelectric generator 190 as the energy conversion unit 122. In this example, the thermoelectric generator 190 has a first heat exchange coil 192 and a second heat exchange coil 194. The first heat exchange coil 192 is partially disposed in the chamber 142 of the first tank 110 and in contact with the first fluid 114. Similarly, the second heat exchange coil 194 is partially disposed in the chamber 162 of the second tank 112 and in contact with the second fluid 116. A solid state module 196 includes first 198 and second 200 opposing substrates, such as ceramic plates, sandwiched over an array 202 of semiconductor units having different Seeback coefficients (e.g., p-doped 195 and n-doped 197 semiconductors) disposed on electrically conductive material, such as series of metal plates 199 that electrically connect the semiconductor unites 195, 197 of the array 202. The first substrate 198 is exposed to the first heat exchange coil 192 and the second substrate 200 is exposed to the second heat exchange coil 194, thereby exposing the first substrate 198 to fluid of a relatively higher temperature and the second substrate 200 to fluid of a relatively lower temperature when the system is in a discharge operational phase, described in detail below. This creates the temperature difference that drives electrical generation. Electrical connectors 204, 206 are in electrical communication with the series of metal plates 199 and carry the current, represented by arrow 208, generated by the thermoelectric generator 190. One or more valves, switches, and/or pumps can be included to control fluid flow through the first 192 and/or second heat exchange coils 194 and, as a result, generation of electricity. Furthermore, a switch 250 operates to selectively establish electrical communication between the energy conversion unit 122 and attached components, such as energy-consuming facility 350 and utility grid 370.

In operation, the system 100 can be selectively switched between different operational phases. Each of FIGS. 4, 5, and 6 illustrates the energy storage system 100 in a particular phase of operation.

During a loading phase, illustrated in FIG. 4, the induction heater 170 is an activated state, converting electricity to heat that is added to the first fluid 114, which raises the temperature of the first fluid 114 in the first fluid storage tank 110. The cooling unit 120 extracts heat from the second fluid 116 in the second fluid storage tank 112. There is no fluid flow to the energy conversion unit 122 in this phase. As a result, the energy conversion unit 122 does not generate electricity during this operational phase.

During a storage phase, illustrated in FIG. 5, the heating 118 and cooling 120 units are not operated and energy loss occurs as the temperature of the first fluid 114 in the first fluid storage tank 110 decreases due to heat transfer to the ground 101 surrounding the first fluid storage tank 110, represented by arrow 117, and the second fluid 116 absorbs heat from the ground 101 surrounding the second fluid storage tank 112, represented by arrow 119, such that the temperature of the second fluid 116 increases. The insulative properties of the fluid storage tanks 110, 112 minimizes the amount of energy loss in this operational phase. There is no fluid flow to the energy conversion unit 122 in this phase. As a result, the energy conversion unit 122 does not generate electricity during this operational phase.

During a discharge phase, illustrated in FIG. 6, fluid flows to the energy conversion unit 122 through both the first heat exchange coil 192 and the second heat exchange coil 194. The fluid flow can be regulated by valves and/or pumps, which can be opened and/or activated to initiate such fluid flow and the discharge phase of operation. As a result of this fluid flow, a temperature difference is created between the first 198 and second 200 substrates, which are exposed to the first heat exchange coil 192 and the second heat exchange coil 194, as described above. This temperature difference generates electricity through the array of semiconductor units 202, producing current 208 that ultimately flows through electrical connectors 204, 206. As a result, and over time during operation in this discharge phase, heat transfers from the first fluid 114 in the first fluid storage tank 110 to the second fluid 116 in the second fluid storage tank 112, represented by arrow 127. A portion of this heat is converted to electric energy, represented by arrow 129, by the energy conversion unit 122 and its exposure to the temperature difference between the first fluid 114 and the second fluid 116. The electric energy is discharged to a downstream consumption, transmission, or storage apparatus 250 that is electrically connected to the energy conversion unit 122. During this operational phase, heat transferred to the second fluid 116 increases the temperature of the second fluid 116 in the second fluid storage tank 112 and reduces the temperature of the first fluid 114 in the first fluid storage tank 110.

The energy storage system 100 can be electrically connected to any suitable consumption, transmission, or storage apparatus, including electrical machinery, a plurality of electrical machines, a main electrical connection to a facility, such as a factory or other business that includes one or more machines that consume electrical energy, a utility power grid, and an energy storage unit, such as a battery.

The energy storage systems described herein provide low efficiency yet highly scalable energy generation, storage, and discharge that is limited primarily by available ground space, making the energy storage systems suitable for installation and deployment at locations in which ground space is not constrained, such as in suburban and rural environments.

The systems described herein can be used to selectively discharge stored energy based on various parameters, including demand for electricity and the current price for electricity. As such, the systems are suitable for use in the inventive methods of selectively discharging electrical energy from an energy storage system, including the example methods described herein.

Inventive methods of selectively discharging electrical energy from an energy storage system include initializing an energy storage system, evaluating demand for energy and price of energy parameters to identify a desirable operational phase of the energy storage system, evaluating the tank temperatures in the fluid storage system, and updating the operational status of the energy storage system, changing the operational phase of the energy storage system to discharge electrical energy if desirable.

Figure 7:
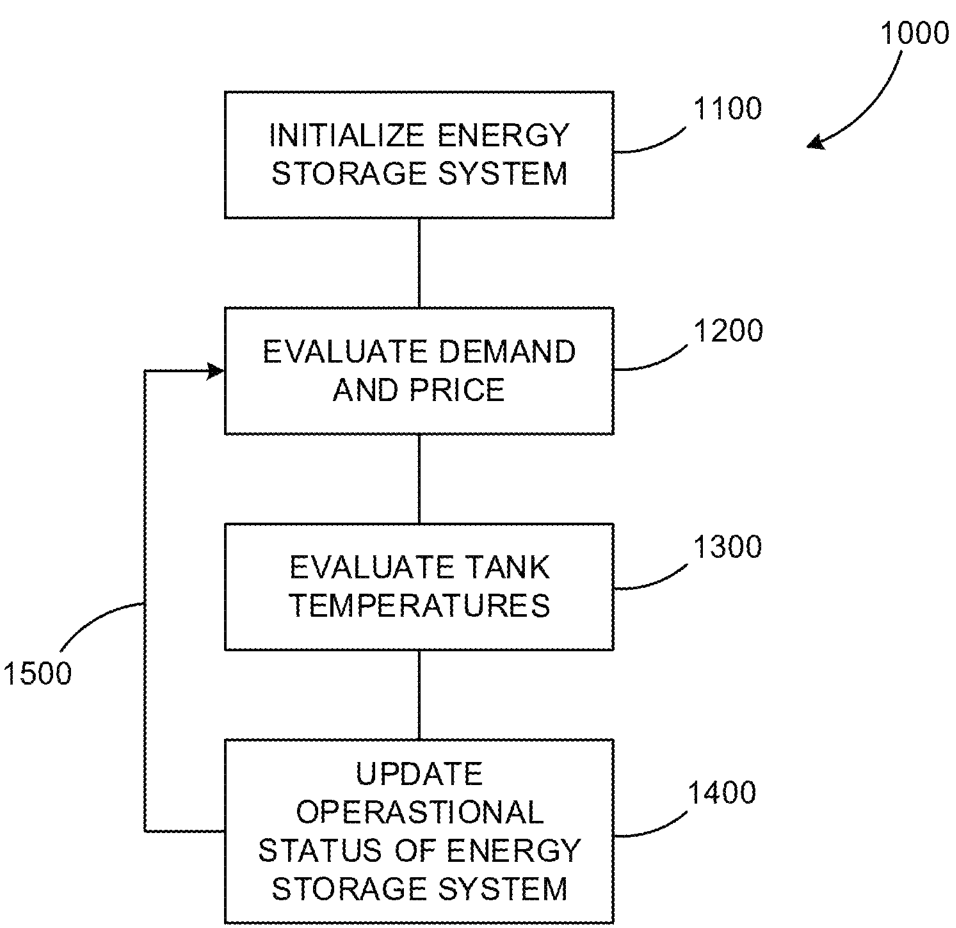
FIG. 7 is a flowchart illustration of an example method of selectively discharging electrical energy from an energy storage system.

FIG. 7 is a flowchart representation of an example method 1000 of selectively discharging electrical energy from an energy storage system. A first step 1100 comprises initializing an energy storage system according to an embodiment. A second step 1200 comprises evaluating demand for electricity and price of electricity parameters to identify a desirable operational phase of the energy storage system based on pre-defined criteria, such as low and high demand triggers and low and high price triggers. A third step 1300 comprises evaluating the tank temperatures in the energy storage system. A fourth step 1400 comprises updating the operational status of the energy storage system based on the evaluating demand and price parameters 1200 and the evaluating tank temperatures 1300.

The step 1100 of initializing an energy storage system according to an embodiment comprises disposing a first fluid in the first fluid storage tank of the energy storage system and disposing a second fluid in the second fluid storage tank of the energy storage system. The energy storage system can be an energy storage system according to any embodiment of the invention, including the example energy storage systems described and illustrated herein. As described above, the first and second fluids advantageously comprise water. Also, in this example method, the energy storage system is in selective electrical communication with a facility that includes electrical machinery, such as a commercial plant, and a utility electrical grid, such as a local electrical utility grid. As illustrated in FIG. 1, the energy storage system includes a switch that allows for selective electrical connection to the facility and the utility electrical grid.

The step 1200 of evaluating demand for electricity and price of electricity parameters to identify a desirable operational phase of the energy storage system based on pre-defined criteria comprises comparing current demand for electrical energy by the facility against pre-defined demand levels, such as a high demand trigger and a low demand trigger. Any suitable pre-defined demand levels can be used, and, for a method according to a particular embodiment will depend on various factors, including the typical demand of the facility connected to the energy storage system and the variability of the demand of the facility. This step 1200 also comprises comparing current price of electricity paid by the facility for electricity supplied to the facility through other means, such as the local electrical utility, against pre-defined prices, such as a high price point and a low price point. Any suitable pre-defined prices can be used, and, for a method according to a particular embodiment, will depend on various factors, including variability the price of electricity and other factors. These two comparisons are included in the step 1200 because it is considered critical that they be performed simultaneously or nearly simultaneously to provide the most efficient and responsive use of the energy storage system. While not necessary to the inventive methods, simultaneous or near simultaneous performance of these comparisons is considered particularly advantageous as it enables real-time energy selection for the facility, allowing the performer of the method to maximize efficiency gains.

The step 1300 of evaluating the tank temperatures in the energy storage system comprises determining the temperature of the first fluid in the first fluid storage tank and determining the temperature of the second fluid in the second fluid storage tank. This step 1300 can be performed using conventional techniques and equipment for determining fluid temperature, such as with standard thermometers, probes, and/or loggers.

The step 1400 of updating the operational status of the energy storage system based on the evaluating demand and price parameters 1200 and the evaluating tank temperatures 1300 can comprise maintaining the current operational phase of the energy storage system or changing the operational phase of the energy storage system. Changing the operational phase of the energy storage system, if included as part of this step 1400, comprises changing the operations phase of the energy storage system from one of a loading, storage, and discharge operational phase, as described above, to another, different phase of the loading, storage, and discharge operational phases. Opening and/or closing of appropriate valves and/or activation of appropriate pumps to initiate or terminate fluid flow to the energy conversion unit are performed, as appropriate, as part of the performance of this step.

The method 1000 is particularly well-suited for continuous performance, providing a method for continuously monitoring facility demand for electricity and price for electricity supplied through means other than the energy storage system. As such, steps 1200, 1300, and 1400 are advantageously repeated, as illustrated by arrow 1500, at a pre-determined frequency. If repetition is included in a method according to a particular embodiment, any suitable frequency can be used and a skilled artisan will be able to select a suitable frequency based on various considerations, including the electricity price sensitivity of the facility and the frequency at which spikes in demand electricity occur for the facility. It is considered advantageous to repeat the steps 1200, 1300, 1400 at a frequency of at least once per hour. It is considered particularly advantageous to repeat the steps 1200, 1300, 1400 at a frequency of at least once per minute. It is considered most advantageous to repeat the steps 1200, 1300, 1400 at a frequency of at least once per second as this provides near real-time adaptability for the facility.

Figure 8:
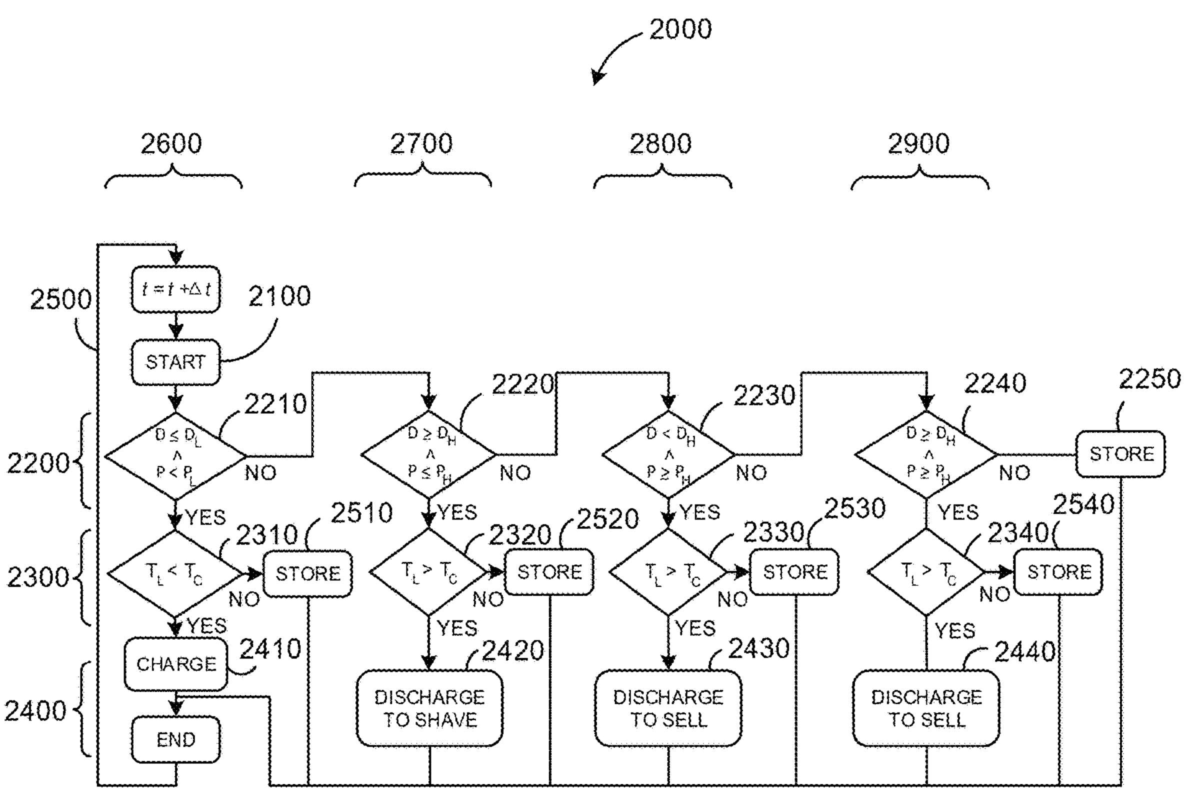
FIG. 8 is a flowchart illustration of another example method of selectively discharging electrical energy from an energy storage system.

FIG. 8 is a flowchart representation of another example method 2000 of selectively discharging electrical energy from an energy storage system. The method 2000 is similar to the method 1000 described above, except as detailed below. Thus, a first step 2100 comprises initializing an energy storage system according to an embodiment. A second step, represented by the evaluation elements in band 2200, comprises evaluating demand for electricity and price of electricity parameters to identify a desirable operational phase of the energy storage system based on pre-defined criteria, such as low and high demand triggers and low and high price triggers. A third step, represented by the evaluation elements in band 2300, comprises evaluating the tank temperatures in the energy storage system. A fourth step, represented in the status elements in band 2400, comprises updating the operational status of the energy storage system based on the evaluating demand and price parameters 2200 and the evaluating tank temperatures 2300. The steps 2200, 2300, and 2400 are repeated at least once per second, represented by arrow 2500 and the time change element 2501.

FIG. 8 illustrates the adaptability provided to a performer of the inventive methods, including method 2000. In column 2600, the evaluating steps 2210, 2310 produce a comparison that necessitates maintaining or changing the operational phase of the energy storage system in or to a loading phase because the temperature of the first fluid in the first fluid storage tank, the hot tank, is less than the temperature of the second fluid in the second fluid storage tank, the cold tank. With this result, heating and/or cooling of the first fluid is required to support a change to a storage or discharge operational phase, so the loading operational phase is maintained or initiated 2410, as appropriate.

In column 2700, the evaluating steps 2220, 2320 produce a comparison that allows the performer of the method to discharge electricity from the energy storage system to supply electricity from the energy storage system to the connected facility, thereby shaving the current demand peak evidenced by the demand exceeding the high demand trigger while avoiding selling energy from the energy storage system into a market in which the price is lower than the high price level. This effectively allows the performer of the method 2000 to efficiently control consumption of electricity by the facility, stabilizing a peak in demand for electricity by using electricity from the energy storage system. This "discharge to shave" mode is achieved by maintaining or changing 2420 the operational phase of the energy storage system in or to a discharge phase and selectively maintaining or establishing electrical connection between the energy storage system and the facility, such as by operation of the switch 250 as illustrated in FIG. 1.

In column 2800, the evaluating steps 2230, 2330 produce a comparison that allows the performer of the method to discharge electricity from the energy storage system to supply electricity from the energy storage system to the connected utility grid, thereby selling electricity into a market in which the price is higher than the high price level. This effectively allows the performer of the method 2000 to take advantage of low demand for electricity from the facility and favorable electricity pricing. This "discharge to sell" mode is achieved by maintaining or changing 2430 the operational phase of the energy storage system in or to a discharge phase and selectively maintaining or establishing electrical connection between the energy storage system and the electrical grid, such as by operation of the switch as illustrated in FIG. 1.

In column 2900, the evaluating steps 2240, 2340 produce a comparison that allows the performer of the method to discharge electricity from the energy storage system to supply electricity from the energy storage system to the connected utility grid, thereby selling electricity into a market in which the price is higher than the high price level. This effectively allows the performer of the method 2000 to ignore a spike in demand for electricity from the facility and take advantage of favorable electricity pricing. This "discharge to sell" mode is achieved by maintaining or changing 2440 the operational phase of the energy storage system in or to a discharge phase and selectively maintaining or establishing electrical connection between the energy storage system and the electrical grid, such as by operation of the switch as illustrated in FIG. 1.

In each column 2600, 2700, 2800, 2900, evaluating steps 2310, 2320, 2330, and 2340 produce a comparison that allows the performer of the method to choose to store potential energy in the energy storage system. This effectively allows the performer of the method to choose to operate the facility using electricity supplied through other means and also to avoid selling electricity produced by the energy storage system into an undesirable market. This is achieved by maintaining or changing 2510, 2520, 2530, 2540 the operational phase of the energy storage system in or to a storage phase by opening and/or closing appropriate valves and/or activating or deactivating appropriate pumps to terminate fluid flow to the energy conversion unit in the energy storage system. Also, the evaluating demand for electricity and price of electricity parameters 2210, 2220, 2230, 2240 in band 2200 default to maintaining or changing 2250 the operational phase of the energy storage system in or to a storage phase. This ensures that the method 2000 defaults to the storage operational phase, which minimizes energy input into the energy storage system while preserving, for a period of time, an ability to change to a discharge operational phase later.

Those with ordinary skill in the art will appreciate that various modifications and alternatives for the described and illustrated examples can be developed in light of the overall teachings of the disclosure, and that the various elements and features of one example described and illustrated herein can be combined with various elements and features of another example without departing from the scope of the invention. Accordingly, the particular examples disclosed herein have been selected by the inventor simply to describe and illustrate examples of the invention and are not intended to limit the scope of the invention or its protection, which is to be given the full breadth of the appended claims and any and all equivalents thereof.

We claim:

1. A method of selectively discharging electrical energy from an energy storage system, the method comprising:

initializing an energy storage system having a loading operational phase, a storage operational phase, and a discharge operational phase and comprising:

a first in-ground fluid storage tank defining a first chamber;

a second in-ground fluid storage tank defining a second chamber;

a first fluid disposed in the first chamber;

a second fluid disposed in the second chamber;

a heating unit operably connected to the first in-ground fluid storage tank and adapted to heat the first fluid;

a cooling unit operably connected to the second in-ground fluid storage tank and adapted to cool the second fluid; and a thermoelectric generator exposed to the first fluid and the second fluid and adapted to convert a temperature difference between the first fluid and the second fluid directly to electrical energy;

evaluating demand for electricity and price of electricity parameters to identify a desirable operational phase of the energy storage system based on pre-defined criteria;

evaluating tank temperatures in the energy storage system by determining a temperature of the first fluid in the first fluid storage tank and determining a temperature of the second fluid in the second fluid storage tank; and updating the operational status of the energy storage system based on the evaluating demand for electricity and price of electricity parameters and the evaluating tank temperatures by maintaining the current operational phase of the energy storage system or changing the operational phase of the energy storage system from one of the loading operational phase, the storage operational phase, and the discharge operational phase to another, different one of the loading operational phase, the storage operational phase, and the discharge operational phase;

wherein the heating unit comprises an electrical induction heater partially disposed in ground adjacent the first in-ground fluid storage tank and having a heating coil disposed within the first chamber and in contact with the first fluid.

2. The method of claim 1, further comprising a second heating unit partially disposed in ground adjacent the first in-ground fluid storage tank and having a second heating coil disposed in the first chamber and in contact with the first fluid.

3. A method of selectively discharging electrical energy from an energy storage system, the method comprising:

initializing an energy storage system having a loading operational phase, a storage operational phase, and a discharge operational phase and comprising:

a first in-ground fluid storage tank defining a first chamber;

a second in-ground fluid storage tank defining a second chamber;

a first fluid disposed in the first chamber;

a second fluid disposed in the second chamber;

a heating unit operably connected to the first in-ground fluid storage tank and adapted to heat the first fluid;

a cooling unit operably connected to the second in-ground fluid storage tank and adapted to cool the second fluid; and a thermoelectric generator exposed to the first fluid and the second fluid and adapted to convert a temperature difference between the first fluid and the second fluid directly to electrical energy;

evaluating demand for electricity and price of electricity parameters to identify a desirable operational phase of the energy storage system based on pre-defined criteria;

evaluating tank temperatures in the energy storage system by determining a temperature of the first fluid in the first fluid storage tank and determining a temperature of the second fluid in the second fluid storage tank; and updating the operational status of the energy storage system based on the evaluating demand for electricity and price of electricity parameters and the evaluating tank temperatures by maintaining the current operational phase of the energy storage system or changing the operational phase of the energy storage system from one of the loading operational phase, the storage operational phase, and the discharge operational phase to another, different one of the loading operational phase, the storage operational phase, and the discharge operational phase;

wherein the cooling unit comprises an electric refrigeration unit disposed in ground adjacent the second tank and having a cooling coil disposed in the second chamber and in contact with the second fluid.

4. A method of selectively discharging electrical energy from an energy storage system, the method comprising:

initializing an energy storage system having a loading operational phase, a storage operational phase, and a discharge operational phase and comprising:

a first in-ground fluid storage tank defining a first chamber;

a second in-ground fluid storage tank defining a second chamber;

a first fluid disposed in the first chamber;

a second fluid disposed in the second chamber;

a heating unit partially disposed in ground adjacent the first in-ground fluid storage tank and having a heating coil disposed within the first chamber and in contact with the first fluid;

a cooling unit disposed in ground adjacent the second in-ground fluid storage tank and having a cooling coil disposed in the second chamber; and a thermoelectric generator exposed to the first fluid and the second fluid and adapted to convert a temperature difference between the first fluid and the second fluid directly to electrical energy;

evaluating demand for electricity and price of electricity parameters to identify a desirable operational phase of the energy storage system based on pre-defined criteria;

evaluating tank temperatures in the energy storage system by determining a temperature of the first fluid in the first fluid storage tank and determining a temperature of the second fluid in the second fluid storage tank;

updating the operational status of the energy storage system based on the evaluating demand for electricity and price of electricity parameters and the evaluating tank temperatures by maintaining the current operational phase of the energy storage system or changing the operational phase of the energy storage system from one of the loading operational phase, the storage operational phase, and the discharge operational phase to another, different one of the loading operational phase, the storage operational phase, and the discharge operational phase; and repeating the evaluating demand for electricity and price of electricity parameters, the evaluating tank temperatures in the energy storage system, and updating the operational status of the energy storage system at a pre-determined frequency of at least once per hour.

5. The method of claim 4, wherein the first fluid and the second fluid are the same.

6. A method of selectively discharging electrical energy from an energy storage system, the method comprising:

initializing an energy storage system having a loading operational phase, a storage operational phase, and a discharge operational phase and comprising:

a first in-ground fluid storage tank defining a first chamber;

a second in-ground fluid storage tank defining a second chamber;

a first fluid disposed in the first chamber, the first fluid comprising water;

a second fluid disposed in the second chamber, the second fluid comprising water;

a heating unit partially disposed in ground adjacent the first in-ground fluid storage tank and having a heating coil disposed within the first chamber and in contact with the first fluid;

a cooling unit disposed in ground adjacent the second in-ground fluid storage tank and having a cooling coil disposed in the second chamber; and a thermoelectric generator exposed to the first fluid and the second fluid and adapted to convert a temperature difference between the first fluid and the second fluid directly to electrical energy;

evaluating demand for electricity and price of electricity parameters to identify a desirable operational phase of the energy storage system based on pre-defined criteria;

evaluating tank temperatures in the energy storage system by determining a temperature of the first fluid in the first fluid storage tank and determining a temperature of the second fluid in the second fluid storage tank;

updating the operational status of the energy storage system based on the evaluating demand for electricity and price of electricity parameters and the evaluating tank temperatures by maintaining the current operational phase of the energy storage system or changing the operational phase of the energy storage system from one of the loading operational phase, the storage operational phase, and the discharge operational phase to another, different one of the loading operational phase, the storage operational phase, and the discharge operational phase; and repeating the evaluating demand for electricity and price of electricity parameters, the evaluating tank temperatures in the energy storage system, and updating the operational status of the energy storage system at a pre-determined frequency of at least once per second.

* * * * *